United States Patent [19]

Eisenbraun et al.

[11] Patent Number: 5,068,131
[45] Date of Patent: Nov. 26, 1991

[54] METHOD FOR PRODUCTION OF ELECTRONIC COATINGS

[75] Inventors: Allan A. Eisenbraun; Wesley C. Blocker, both of Baton Rouge, La.

[73] Assignee: Ethyl Corporation, Richmond, Va.

[21] Appl. No.: 581,911

[22] Filed: Sep. 13, 1990

Related U.S. Application Data

[62] Division of Ser. No. 255,747, Oct. 11, 1988, Pat. No. 4,997,869.

[51] Int. Cl.$^5$ .............................................. B05D 3/12
[52] U.S. Cl. .................................... 427/240; 427/346; 427/385.5; 524/600; 528/176; 528/188; 528/353
[58] Field of Search ............... 427/240, 346, 385.5; 524/104, 173, 233, 600; 528/353, 176, 188

[56] References Cited

U.S. PATENT DOCUMENTS

| | | | |
|---|---|---|---|
| 4,111,906 | 9/1978 | Jones et al. | 528/353 |
| 4,433,131 | 2/1984 | Bolon et al. | 524/600 |
| 4,495,321 | 1/1985 | Arnold | 524/600 |
| 4,533,574 | 8/1985 | Fryd et al. | 524/600 |
| 4,792,476 | 12/1988 | Numata et al. | 428/435 |
| 4,877,653 | 10/1989 | Vora et al. | 427/385.5 |

Primary Examiner—Norman Morgenstern
Assistant Examiner—Terry J. Owens
Attorney, Agent, or Firm—John F. Sieberth; Richard L. Hansen

[57] ABSTRACT

In humid atmospheres (e.g., 40% relative humidity or above) solutions of 2,2-bis(3,4-dicarboxyphenyl)hexafluoropropane dianhydride/2,2-bis[4-(aminophenoxy)-phenyl]hexafluoropropane polyimides tend to be unstable in the sense that during spin coating operations undesirable precipitate formation occurs on the rotating surface of the wafer. The result is the formation of unacceptable coatings due to their irregularity and lack of uniformity. Described are solutions of these polyimide polymers in a solvent containing one or more liquid aromatic hydrocarbons having a boiling point at least about 110° C. and one or more dipolar aprotic solvents having a boiling point of at least about 150° C., such that the solution (a) contains on a weight basis from about 5% to about 50% of the polyimide, and (b) does not undergo precipitate formation during spin coating in an atmosphere of up to about 55% relative humidity.

8 Claims, No Drawings

METHOD FOR PRODUCTION OF ELECTRONIC COATINGS

This application is a division of application Ser. No. 07/255,747, filed Oct. 11, 1988, now Pat. No. 4,997,869.

BACKGROUND

Polymides derived from 2,2-bis(3,4-dicarboxyphenyl)hexafluoropropane dianhydride and 2,2-bis[4-(aminophenoxy)phenyl]hexafluoropropane are useful, inter alia, for the production of electronic coatings on semiconductor wafers, such as polysilicon wafers. In order to apply solutions of such polyimides to the wafers spin coating procedures are used, and in these operations purity, integrity, and uniformity of the resultant polyimide coating are essential.

Unfortunately it has been discovered that in humid atmospheres (e.g., 40% relative humidity or above) solutions of such polyimides in some commonly used solvents (e.g., N-methylpyrrolidone) tend to be unstable in the sense that during spin coating operations undesirable precipitate formation occurs on the rotating surface of the wafer. The result is that the coating loses adhesion to the wafer and flies off of it during spin coating.

The need thus exists for solutions of 2,2-bis(3,4-dicarboxyphenyl)hexafluoropropane dianhydride/2,2-bis[4-(aminophenoxy)phenyl]hexafluoropropane polyimides which do not undergo undesirable precipitate formation on rotating wafer surfaces when used in spin coating operations even if conducted under conditions of 55% relative humidity. This invention is deemed to fulfill this need in an effective and efficient manner.

THE INVENTION

In accordance with this invention there is provided a partially fluorinated polyimide composition especially adapted for use in spin coating wafers of semiconductive materials. Such composition comprises a solution of (i) a 2,2-bis(3,4-dicarboxyphenyl)hexafluoropropane dianhydride/2,2-bis[4-(aminophenoxy)phenyl]hexafluoropropane polyimide polymer having an inherent viscosity in the range of about 0.05 to about 1.5 dL/g—as measured in N-methylpyrrolidone at room temperature (25° C.) at a concentration of 0.5 g/dL—in (ii) a solvent containing at least 40% by weight of one or more liquid aromatic hydrocarbons having a boiling point of at least about 110° C. and at least 5% by weight of one or more dipolar aprotic solvents having a boiling point of at least about 150° C., such that the solution (a) contains on a weight basis from about 5% to about 50% of such polyimide and (b) does not undergo precipitate formation during spin coating in an atmosphere of up to about 55% relative humidity. These solutions preferably contain on a weight basis from about 10% to about 35% of such polyimide. It is also preferable that the inherent viscosity of the polyimide (as measured at a concentration of 0.5 g/dL in N-methylpyrrolidone at room temperature) fall in the range of about 0.1 to about 0.9 dL/g.

Preferably, the polyimide is produced in the above aromatic hydrocarbon-dipolar aprotic solvent blend (with or without additional co-solvent) although if desired, it may be formed in a different reaction medium, recovered therefrom, and then dissolved in the above solvent blend or component thereof (with or without additional co-solvent). Alternatively, the polyimide may be formed in the dipolar aprotic solvent, and the above aromatic hydrocarbon may then be added thereto, with one or more co-solvents introduced at any suitable stage of the overall operation. As is well known, polyimides are formed by reacting essentially equimolar proportions of a primary diamine with a tetracarboxylic acid or derivative thereof, preferably the dianhydride of the tetracarboxylic acid. Thus in the practice of this invention it is preferred to produce the solutions by reacting in an appropriate reaction solution an essentially equimolar mixture of 2,2-bis(3,4-dicarboxyphenyl)hexafluoropropane dianhydride and a 2,2-bis[4-(aminophenoxy)phenyl]hexafluoropropane, e.g. 2,2-bis[4-(3-aminophenoxy)phenyl]hexafluoropropane, a mixture of 2,2-bis[4-(3-aminophenoxy)phenyl]hexafluoropropane and 2,2-bis[4-(4-aminophenoxy)phenyl]hexafluoropropane, or most preferably, 2,2-bis[4-(4-aminophenoxy)phenyl]hexafluoropropane.

At some stage during or after the reaction, the solution should be heated to a suitable high temperature (usually in the vicinity of 140° C. or above) in order to convert any intermediate polyamic acid into polyimide.

As noted above, the solvent used in the compositions of this invention contains both one or more liquid aromatic hydrocarbon having a boiling point of at least about 110° C. and one or more dipolar aprotic solvents having a boiling point of at least about 150° C. Other solvents may be copresent provided they do not, in the concentrations employed, adversely affect the stability and desirable spin coating characteristics of the resultant solution when used in an atmosphere of up to 55% relative humidity. Generally speaking, other solvents which may be present in appropriate proportions include ethers, aromatic hydrocarbons having boiling points below about 110° C., cycloaliphatic ketones, and the like.

Examples of liquid aromatic hydrocarbons boiling above 110° C. include
1,2,3,4-tetramethylbenzene
1,2,3,5-tetramethylbenzene
toluene
o-xylene
m-xylene
p-xylene
1,2-diethylbenzene
1,3-diethylbenzene
1,4-diethylbenzene
3,5-diethyltoluene
n-butylbenzene
3-propyltoluene
4-propyltoluene
tetrahydronaphthalene
and the like, including mixtures of two or more such aromatic solvents.

Examples of dipolar aprotic solvents boiling above 150° C. include
N-methylpyrrolidone
N,N-dimethylformamide
N,N-dimethylacetamide
dimethylsulfoxide
and the like, including mixtures of two or more such dipolar aprotic solvents.

Examples of suitable co-solvents include
cyclohexanone
2-methylcyclohexanone
3-methylcyclohexanone
4-methylcyclohexanone
2,5-dimethylcyclohexanone 2,6-dimethylcyclohexanone
cycloheptanone
cyclooctanone
isophorone
tetrahydrofuran
diethylene glycol dimethyl ether
triethylene glycol dimethyl ether
dimethoxyethane
acetone
methylethylketone
and the like, including mixtures of two or more such solvents.

Liquid methylbenzenes having boiling points above 130° C. are the most preferred aromatic hydrocarbons for use in the practice of this invention. The most preferred dipolar aprotic solvent for such use in N-methylpyrrolidone.

Needless to say, the reactants and solvents used in forming the compositions of this invention should have sufficiently high purities to satisfy the requirements of electronic coatings. Thus the solids are preferably recrystallized from highly pure solvents and the liquids are preferably purified by use of distillation or other purification techniques.

In another of its forms, this invention provides a method of forming a coating upon a planar substrate such as a semiconductor wafer. In this method a suitable quantity of a composition of this invention is applied to the central region of the planar surface and the substrate is rotated at a speed sufficient through centrifugal effect to cause the composition to flow outwardly to the perimeter of the surface and in so doing form a substantially uniform liquid coating thereon. Ordinarily rotational speeds in the range of about 1,000 to about 10,000 rpm for periods in the range of about 10 seconds to about 5 minutes are most useful, although departures from either or both of these ranges may be employed where the circumstances warrant or justify such departures. Generally speaking, the higher the rotational speed, the thinner the coating. Once the liquid coating has been formed over the planar surface the coated substrate is heated to an elevated temperature normally in the range of about 80° to about 130° C. to dry the coating without destroying its integrity. Thereafter the dried coating is heated to a still higher temperature (e.g., in the range of about 200° C. to about 450° C.) to bake the coating. It has been found that if the dry coated substrate is heated to a temperature of at least about 350° C., the solvent resistance of the coating is improved.

A wide variety of substrates may be coated in this manner, including metals, ceramics, high temperature resistant polymers, intermetallic compounds and compound semiconductors (e.g., GaAs, GaAs$_x$P$_{1-x}$, etc.), and the like. Usually, but not necessarily, the substrate will be in the form of a disc or wafer.

The practice and advantages of this invention are illustrated in the following examples. Examples 1-3 typify the procedures that may be used to produce the compositions of this invention. The manner by which the compositions of this invention may be used in spin coating operations is illustrated in Example 4.

EXAMPLE 1

2,2-Bis(3,4-dicarboxyphenyl)hexafluoropropane dianhydride/2,2-bis[4-(aminophenoxy)phenyl]hexafluoropropane polyimide was produced as follows: 2,2-Bis(3,4-dicarboxyphenyl)hexafluoropropane dianhydride (21.302 g) was added to a stirred solution of 24.926 g of 2,2-bis[4-(4-aminophenoxy)phenyl]hexafluoropropane in 112.33 g of N-methylpyrrolidone (NMP) heated to 80° C. Stirring was effected by means of a double spiral agitator, and the system was maintained under a dry nitrogen atmosphere. An additional 19.44 g of NMP was used to rinse the anhydride into the diamine solution. The reaction mixture was slowly heated to 198.5° C. over a period of 2.25 hours with stirring, and during this time 20.7 mL of a mixture of water and NMP distilled out of the reaction vessel. The reaction mixture—a viscous solution of the polyimide in NMP—was allowed to cool to room temperature. A sample of the solid polyimide polymer (precipitated from solution by addition of deionized water and then thoroughly washed with deionized water and dried under vacuum) was found to have an inherent viscosity of 0.65 dL/g as measured in N-methylpyrrolidone at room temperature (25° C.) at a polyimide concentration of 0.5 g/dL. Solutions of this invention may be formed by diluting individual portions of the viscous reaction mixture with appropriate quantities of suitable aromatic solvents such as 1,2,3,4-tetramethylbenzene (TMB) and stirring the mixture for two hours.

EXAMPLE 2

Using the procedure described in Example 1, an NMP solution of 2,2-bis(3,4-dicarboxyphenyl)hexafluoropropane dianhydride/2,2-bis[4-(aminophenoxy)phenyl]hexafluoropropane polyimide was produced employing reaction temperatures of 197°-198° C. and a longer reaction period. The product solution was found to have a solids content of 27.0% as compared to a calculated value of 26.7%. A sample of the solid polyimide polymer, isolated as in Example 1, had an inherent viscosity of 0.72 dL/g as measured in N-methylpyrrolidone at room temperature (25° C.) at a polyimide concentration of 0.5 g/dL. A solution of this invention (12% solids content) was formed by diluting an 8.044 g portion of the viscous reaction mixture with 9.711 g of TMB and stirring the mixture thoroughly.

EXAMPLE 3

2,2-Bis(3,4-dicarboxyphenyl)hexafluoropropane dianhydride/2,2-bis[4-(aminophenoxy)phenyl]hexafluoropropane polyimide was produced as follows: 2,2-Bis(3,4-dicarboxyphenyl)hexafluoropropane dianhydride (21.302 g) was added to a stirred solution of 24.926 g of 2,2-bis[4-(4-aminophenoxy)phenyl]hexafluoropropane in 112.04 g of N-methylpyrrolidone (NMP) heated to 82° C. Stirring was effected by means of a double spiral agitator, and the system was maintained under a dry nitrogen atmosphere. An additional 19.74 g of NMP was used to rinse the anhydride into the diamine solution. The reaction mixture was slowly heated to 199° C. over a period of 2.5 hours with stirring, and during this time 8.4 mL (8.77 g) of a mixture of water and NMP distilled out of the reaction vessel. The reaction mixture—a viscous solution of the polyimide in NMP—was allowed to cool to room temperature and found to have a solids content of 26.6% as compared to a calculated value of 26.3%. A 23.08 g portion of this solution was diluted with 100.02 g of NMP and one-half of the resultant diluted solution was added slowly to 500 mL of deionized water while continuously agitating the system in a Waring blender. The solid polyimide polymer which precipitated was recovered by filtration and slowly added to another 500 mL of deionized water continuously being agitated in a WARING blender. The so-washed polymer was recovered by filtration, and this water-washing and filtration procedure was repeated once again with another 500 mL quantity of deionized water. The solid polymer was then dried at 55° C. under reduced pressure (0.1 mm Hg). The polyimide was found to have an inherent viscosity of 0.78 dL/g as measured at room temperature (25° C.) in N-methylpyrrolidone at a polyimide concentration of 0.5 gram per deciliter. A portion of this solid polymer was used to form a 20% solids solution in a solvent composed of 80% TMB and 20% NMP.

EXAMPLE 4

Spin coating tests were carried out in order to determine the behavior of different polyimide solutions under conditions of controlled relative humidity. The procedure employed in these tests involved use in a room of controllable humidity of a spin coater equipped with a rotatable vacuum chuck for holding the wafer in place in a horizontal position, and a fume exhaust system. Commercially available silicon wafers three inches in diameter were used as the substrates for the coatings. With the wafer held in a horizontal non-rotating position, a quantity of approximately three grams of coating solution was applied to the center of the wafer, and the wafer was then spun at 5000 rpm for one minute. During this time the wafer was subjected to visual observation to determine the characteristics of the coating. Coatings which develop a milky white appearance (precipitate formation) or which spin off pieces of coating are unsatisfactory. Satisfactory coatings show neither such defect; rather, they remain clear, smooth and uniform in appearance.

The results of these tests are summarized in the following table wherein CH designates cyclohexanone, No PPT signifies that no precipitate formation occurred during the spin coating operation, and PPT signifies that precipitate formation occurred during the spin coating operation. The percentages shown for the solvent and solids (solids represents the concentration of the polyimide in the solvent) are on a weight basis, and the inherent viscosities shown (which are a measure of the molecular weights of the polyimide polymers) were measured in N-methylpyrrolidone at room temperature (25° C.) at a polyimide concentration of 0.5 g/dL, and are expressed in terms of deciliter per gram.

TABLE

| Results of Spin Coating Operations | | | | |
|---|---|---|---|---|
| Run No. | Solvent | Solids, % | Inherent Viscosity | Relative Humidity, % | Behavior During Spin |

| Comparative Compositions: | | | | | |
|---|---|---|---|---|---|
| 1 | 100% NMP | 19 | 1.00 | 30 | No PPT |
| 2 | 100% NMP | 19 | 1.00 | 40 | PPT |
| 3 | 100% NMP | 19 | 0.65 | 44–49 | PPT |
| 4 | 100% NMP | 12 | 0.65 | 44–49 | PPT |
| 5 | 35% NMP-65% CH | 12 | 0.65 | 44–49 | PPT |
| 6 | 60% NMP-40% CH | 19 | 0.65 | 44–49 | PPT |
| 7 | 65% NMP-35% TMB | 19 | 0.72 | 51 | PPT |
| 8 | 66% NMP-34% TMB | 19 | 0.72 | 51 | PPT |
| Compositions of this Invention: | | | | | |
| 9 | 32% NMP-68% TMB | 12 | 0.72 | 51 | No PPT* |

TABLE-continued

| Results of Spin Coating Operations | | | | | |
|---|---|---|---|---|---|
| Run No. | Solvent | Solids, % | Inherent Viscosity | Relative Humidity, % | Behavior During Spin |
| 10 | 20% NMP-80% TMB | 20 | 0.78 | 55 | No PPT |

*At 56% relative humidity this solution did form a precipitate.

While the compositions of this invention are well adapted for use in spin coating applications, they may be used for other purposes, such as in formation of coatings by spray coating or immersion techniques, formation of films by solvent casting procedures, formation of composites by impregnation, and the like.

The foregoing disclosure has been presented for purposes of illustration and not limitation. As can readily be appreciated by those skilled in the art, this invention is susceptible to considerable variation in its practice within the spirit and scope of the ensuing claims.

What is claimed is:

1. A method of forming a coating upon a planar substrate which comprises (a) applying to the central region of the planar surface a partially fluorinated polyimide composition, hereinafter specified, (b) rotating the substrate at a speed sufficient through centrifugal effect to cause the composition to flow outwardly toward the perimeter of the surface and form a substantially uniform liquid coating thereon, and (c) drying the coating by heating the same to an elevated temperature; said composition comprising a solution of (i) a 2,2-bis(3,4-dicarboxyphenyl)hexafluoropropane dianhydride/2,2-bis[4-(aminophenoxy)phenyl]hexafluoropropane polyimide polymer having an inherent viscosity in the range of about 0.05 to about 1.5 dL/g (as measured in N-methylpyrrolidone at room temperature at a concentration of 0.5 g/dL) in (ii) a solvent containing at least 40% by weight of one or more liquid aromatic hydrocarbons having a boiling point of at least about 110° C. and at least 5% by weight of one or more dipolar aprotic solvents having a boiling point of at least about 150° C., such that said solution (a) contains on a weight basis from about 5% to about 50% of such polyimide, and (b) does not undergo precipitate formation during spin coating in an atmosphere of up to about 55% relative humidity; said method being further characterized in that it is conducted in an atmosphere having a relative humidity that does not result in such precipitate formation during the rotation in (b).

2. A method of claim 1 wherein the dried coating is thereafter heated to a temperature of at least about 350° C.

3. A method of claim 1 wherein the rotational speed in (b) is in the range of about 1,000 to about 10,000 rpm.

4. A method of claim 1 wherein the rotational speed in (b) is in the range of about 1,000 to about 5,000 rpm.

5. A method of claim 1 wherein the substrate is in the form of a disc or wafer.

6. A method of claim 1 wherein the substrate is a semiconductor wafer.

7. A method of claim 1 wherein the solution contains on a weight basis from about 10% to about 35% of such polyimide, wherein the inherent viscosity of the polyimide as measured in N-methylpyrrolidone at room temperature at a concentration of 0.5 g/dL is in the range of about 0.1 to about 0.9 dL/g, and wherein the dried coating is thereafter heated to a temperature of at least about 350° C.

8. A method of claim 7 wherein the 2,2-bis[4-(aminophenoxy)phenyl]hexafluoropropane of said polyimide is 2,2-bis[4-(4-aminophenoxy)phenyl]hexafluoropropane.

* * * * *